(12) United States Patent
Shirazi et al.

(10) Patent No.: US 8,868,396 B1
(45) Date of Patent: Oct. 21, 2014

(54) VERIFICATION AND DEBUGGING USING HETEROGENEOUS SIMULATION MODELS

(75) Inventors: Nabeel Shirazi, Saratoga, CA (US); L. James Hwang, Portola Valley, CA (US); Chi Bun Chan, San Jose, CA (US); Hem C. Neema, Sunnyvale, CA (US); Kumar Deepak, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 1228 days.

(21) Appl. No.: 12/605,077

(22) Filed: Oct. 23, 2009

(51) Int. Cl.
*G06F 17/50* (2006.01)

(52) U.S. Cl.
USPC .............................................. 703/14; 703/13

(58) Field of Classification Search
None
See application file for complete search history.

(56) References Cited

U.S. PATENT DOCUMENTS

| | | | |
|---|---|---|---|
| 6,993,736 B2 * | 1/2006 | Syed et al. ................... | 716/106 |
| 7,346,481 B1 | 3/2008 | Ballagh et al. | |
| 7,433,813 B1 | 10/2008 | Ballagh et al. | |
| 7,607,116 B2 * | 10/2009 | Kwon ........................ | 716/106 |
| 8,020,124 B2 * | 9/2011 | Alexanian et al. ............ | 716/106 |
| 2009/0150839 A1 * | 6/2009 | Huang et al. ...................... | 716/5 |

OTHER PUBLICATIONS

Cormen et al., "Introduction to Algorithms", Second Edition, The MIT Press, 2001.*

* cited by examiner

*Primary Examiner* — Omar Fernandez Rivas
*Assistant Examiner* — Herng-Der Day
(74) *Attorney, Agent, or Firm* — LeRoy D. Maunu

(57) ABSTRACT

A method and apparatus for verifying and debugging a circuit design module of a high level programming system is disclosed herein. A circuit design created in a high level programming environment must undergo a number of transformations as it is compiled into a form that can be realized in hardware. At each transformative step, the behavior of the circuit must be verified with a simulation model and debugged if the transformation has changed the behavior of the circuit. The claimed invention presents a novel approach for verifying and debugging between different simulation models and achieves an advance in the art by utilizing the modularized structure of a high-level circuit design to systematically identify simulation mismatches among different simulation models and determine which portions of the circuit design are responsible for the discrepancy.

15 Claims, 8 Drawing Sheets

VERIFICATION AND DEBUGGING USING HETEROGENEOUS SIMULATION MODELS

FIELD OF THE INVENTION

The present invention generally relates to the simulation and debugging of circuit designs.

BACKGROUND

Due to advancements in processing technology, complex integrated circuits (ICs) can be designed using various levels of abstraction. Using a hardware description language (HDL), circuits can be designed at the gate level, the register transfer level (RTL), and higher logical levels. When designing using an HDL, the designer describes a module in terms of signals that are generated and propagated through combinatorial modules from one set of registers to another set of registers. HDLs provide a rich set of constructs to describe the functionality of a module. Modules may be combined and augmented to form even higher level modules.

When ICs are designed at a higher level, lower level representations are needed before a design can be fabricated or implemented on hardware. For example, if a design is to be implemented on a programmable logic device (PLD), the process to translate the design into an executable form includes: synthesis, mapping, placement, routing, and bitstream generation. At each step, transformations occur which may introduce an error into the design. Design engineers generally utilize a wide range of tools enabling them to initially automate these steps and then modify, test, and debug at each level as needed to optimize performance and ensure correctness of the IC.

In order to verify that the circuit will behave as expected, simulations are conducted at the different stages of the design flow. The verification and debugging at the various stages can be complex, time consuming, and prone to human error, since the designer must manually track down the origin of any inconsistencies by tracing signal and state transitions at each level.

The present invention may address one or more of the above issues.

SUMMARY

In some various embodiments of the present invention, a process is provided for verifying and debugging a circuit design module including one or more sub-modules. The circuit design module is simulated on two or more different simulation models. The output resulting from these simulations is then compared to determine whether a discrepancy exists between the results of the simulations. If a discrepancy exists, information is stored indicating that the module is operating in error. The process then simulates any sub-modules of the module operating in error using each of the simulation models, and compares the simulation output of each module to determine if the sub-module is operating in error. This process is repeated for each sub-module operating in error as if the sub-module were the original module simulated.

In other various embodiments, a system is provided for verifying and debugging a circuit design module including one or more sub-modules. The system comprises a processor coupled to a memory storage arrangement. The memory is for storing a circuit design. The processor and memory are coupled to perform operations including: simulating a module of circuit design on different simulation models; and comparing the generated output of the simulations. The processor determines whether a discrepancy exists between the simulation output of the different models, and in response to a discrepancy, the processor and memory are coupled to simulate any sub-modules of a module or sub-module operating in error using each of the simulation models. The processor then compares the simulation output of each model to determine if the sub-module is operating in error.

In other various embodiments, an article of manufacture is provided for verifying and debugging a circuit design module including one or more sub-modules. The article of manufacture comprises an electronically readable storage medium storing instructions executable on a processor. The instructions cause a processor to simulate the circuit design on two or more different simulation models including at least a first simulation model and a second simulation model of the module. As instructed, the output resulting from these simulations is then compared to determine whether a discrepancy exists between the results of the simulations. If a discrepancy exists, information is stored indicating that the module is operating in error. As instructed, the processor then simulates any sub-modules of the module operating in error using each of the simulation models and compares the simulation output of each module to determine if the sub-module is operating in error. The instructions cause the processor to repeat this process for each sub-module operating in error as if the sub-module were the original module simulated.

It will be appreciated that various other embodiments are set forth in the Detailed Description and Claims, which follow.

DETAILED DESCRIPTION

Figure 1:
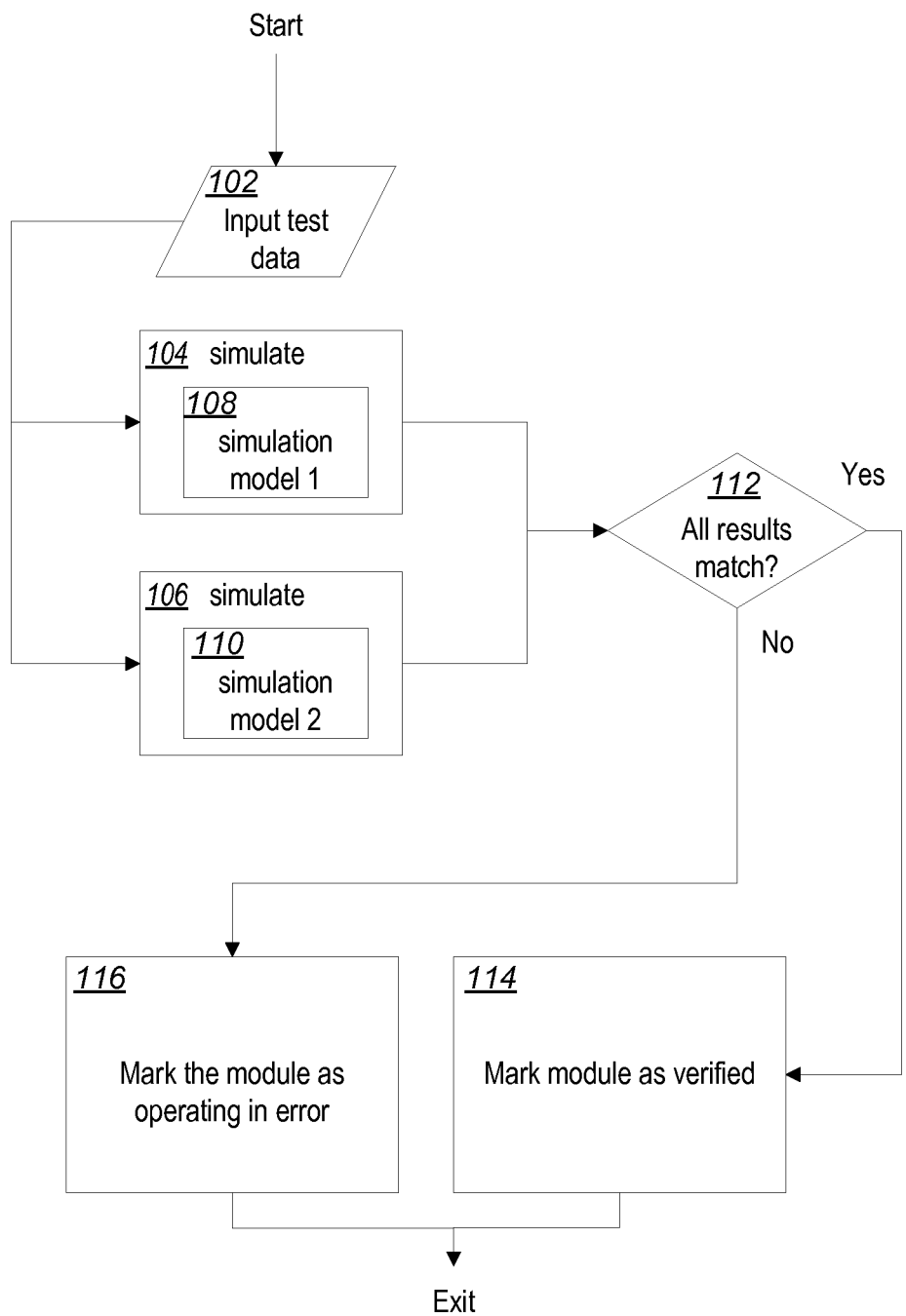
FIG. 1 illustrates a flow diagram of a process to verify a module of a circuit design in accordance with various embodiments of the invention.

When ICs are designed at a higher level, lower level representations are needed before a design can be fabricated or implemented on hardware. When a higher level representation is converted into a lower level repetition, transformations occur which may introduce an error into the design. In order to verify the expected behavior, simulations are conducted on each level of representation using a different simulation model for each level of representation. Simulation results of the different simulation models are compared, to ensure no logical change has occurred during conversion from a higher level to a lower level of representation.

The embodiments of the invention provide various approaches for verifying and debugging between different simulation models. The modularized structure of a high-level circuit design is used to systematically identify simulation mismatches among different simulation models and determine which portions of the circuit design are responsible for the discrepancy.

In an object oriented or modularized circuit design, smaller designs are compartmentalized into modules, combined with other modules or additional circuitry, and incorporated into larger designs. The embodiments of the present invention organize the hierarchy of modules into a tree data structure and use a divide and conquer approach to detect and trace the sources of errors. Each module is represented by a node in the tree, and its sub-modules correspond to the children of the node. If an error is detected in a module, the error may be caused by either a faulty sub-module incorporated into the module or by faulty non-modularized circuitry or code within the module. The tree is traversed in a top down fashion to verify modules and determine the source of any error detected. By simulating and comparing results on a modular level, the process of configuring simulations, comparing results, and tracing errors can be automated.

The circuit design itself is treated as the top-level module and is the starting point for verification. For each level in the hierarchy, the module(s) at that level of the hierarchy is simulated with different simulation models of the same modules to verify whether they are operating correctly. For example, one of the simulation models may be for a functional simulation and another of the simulation models may be for a post-placed-and-route simulation. The output from the different simulation models is compared for verifying proper behavior of the simulated modules. If verification indicates a discrepancy between results of the simulation models, the module is marked as operating in error and is subjected to a further examination. If a module found to be operating in error contains sub-modules, then each sub-module of that module is examined in a similar fashion until the bottom level of the hierarchy is reached. At each level, sub-modules are separately simulated and verified to determine which, if any, are also operating in error and could be the source of the discrepancy. For each module or sub-module in which a simulation discrepancy is found, the process is repeated until the module in error cannot be further subdivided into sub-modules. If no discrepancy between simulation model results is detected, the search does not proceed down the sub-modules of that module. The iterative process traces sources of the simulation discrepancy to the lowest level in the hierarchy.

A module may be verified by simulating the portion of the circuit design represented by the module using two or more different simulation models for the same module. The input simulation test vectors are based on the simulation data in the high-level functional simulation model. The simulated results of each simulation model are compared, and if no discrepancy is found the portion of the circuit and all sub-modules contained within are verified. Otherwise, if a discrepancy between simulation models is detected, the module is considered to operate in error.

FIG. 1 illustrates a flow diagram of a process to verify a module of a circuit design in accordance with various embodiments of the invention. To verify the module, simulations are performed at steps 104 and 106 with simulation models 108 and 110 using input test data 102. Simulation results from each simulation model are compared at step 112. If simulation results are identical for all simulation models, the process indicates the module is verified at step 114. Otherwise, the process indicates the module is operating in error at step 116.

If all modules are verified for the simulation, various embodiments of the invention can iteratively repeat verification of the circuit design with different simulation data (not shown). One example of this repetition is the iterative simulation of individual clock cycles in a cycle-based simulation, wherein simulation results of the previous simulation are used as simulation data for the next simulation iteration. In various embodiments of the invention, results of each iterative simulation are displayed to the user as results are generated. When a mismatch is detected between simulation model results, further simulation iterations are stopped and the source of the error is traced and displayed to the user.

Figure 2:
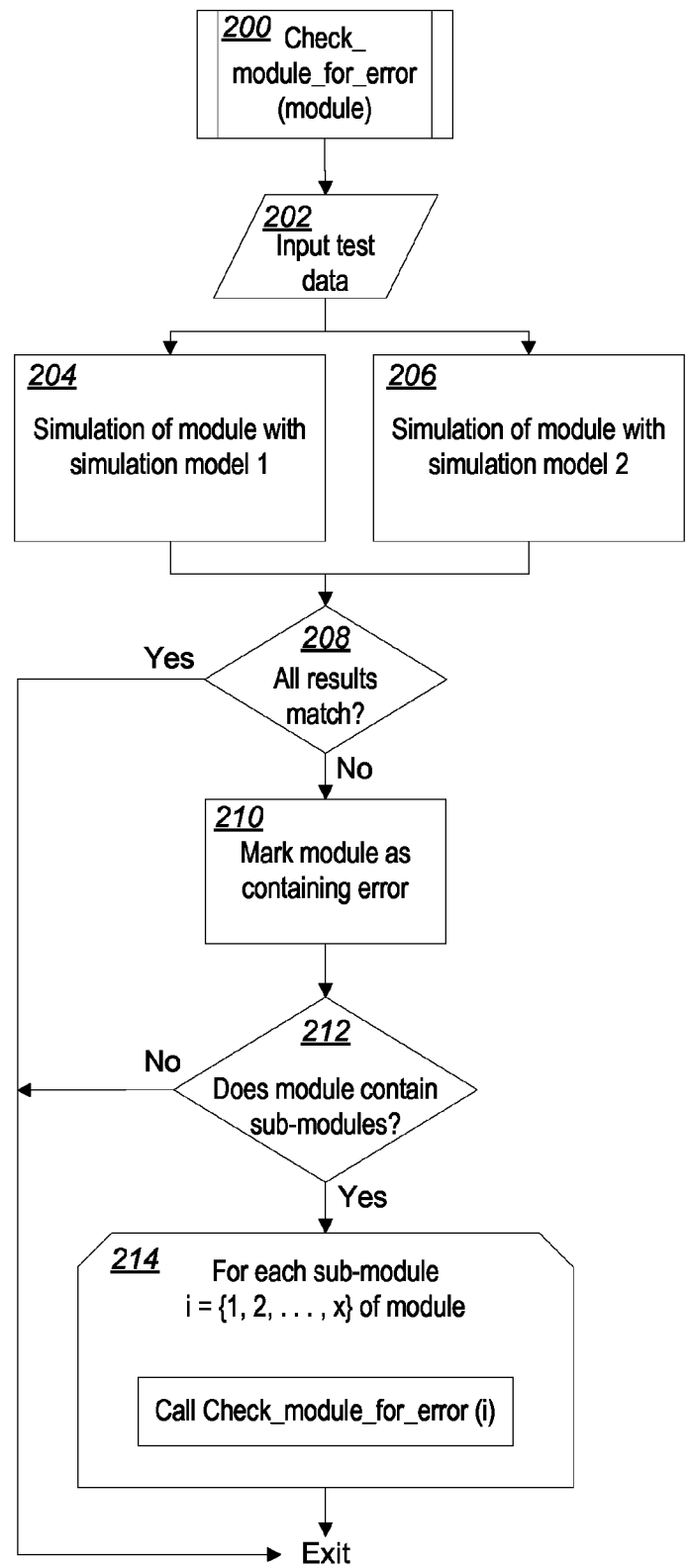
FIG. 2 illustrates a flow diagram of one process for simulating and debugging a module of a circuit design in accordance with various embodiments of the invention.

FIG. 2 is a flow diagram of a process 200 for verifying a module of a circuit design and tracing the source of any error found in accordance with various embodiments of the invention. The module is simulated using two or more simulation models using test input data 202 at steps 204 and 206. In one embodiment, the simulations may be run concurrently. Simulation results from each simulation model are compared, and if there is no discrepancy between simulation results, the module and any sub-modules are verified and decision step 208 directs the process to exit. If a discrepancy between the simulation models exists, decision step 208 directs the process to step 210, where data are stored, indicating the module is operating in error. If the module with the discrepancy contains any sub-modules, decision step 212 causes the verification process 200 to call the verification process 200 (Check_module_for_error(i)) at step 214 for each sub-module. This process will repeat until a module in error has no sub-modules or until all the sub-modules of a module in error have been verified.

Figure 3A:
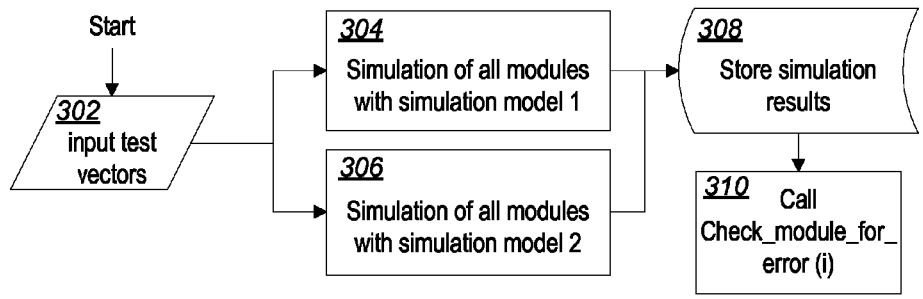
FIG. 3A and FIG. 3B illustrate flow diagrams of a second process for simulating and debugging a module of circuit design in accordance with various embodiments of the invention.
Figure 3B:
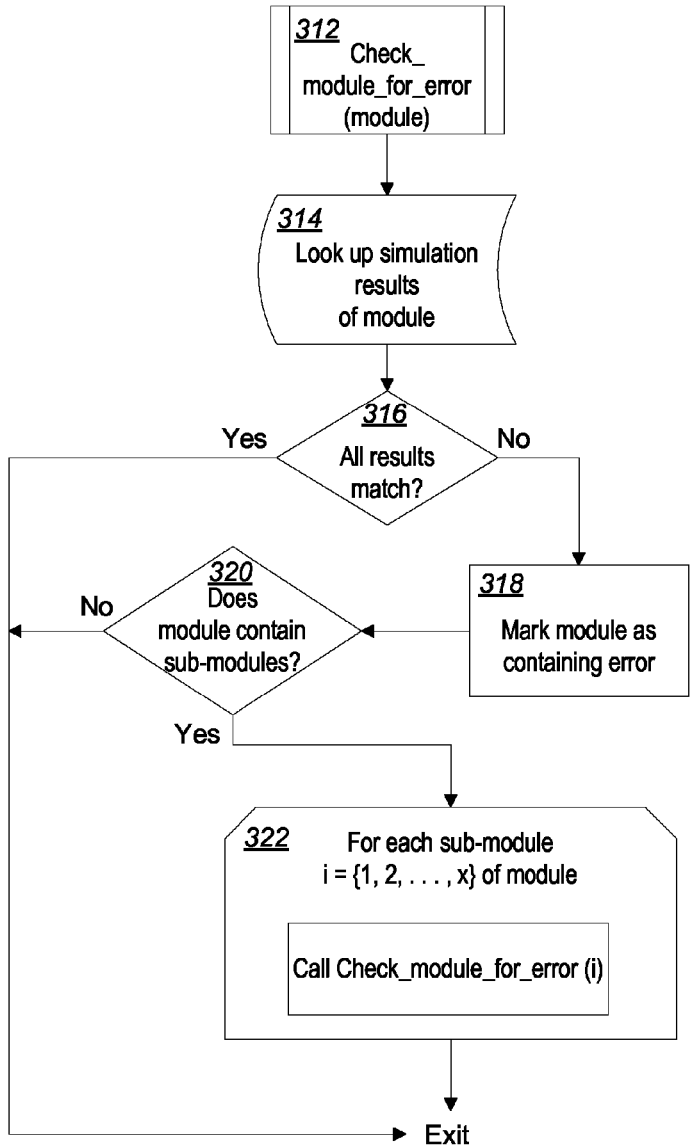

FIGS. 3A and 3B illustrate a flow diagram of a process to verify a module of a circuit design in accordance with various embodiments of the invention. The process in FIGS. 3A and 3B differs from the process in FIG. 2 in that the simulation steps shown in FIG. 3A are separated from the comparison steps of FIG. 3B. FIG. 3A performs a complete simulation, based on simulation input data 302, using at least two simulation models for all modules at steps 304 and 306. The simulation results of all modules are stored for later comparison at step 308. The design may then be verified by calling the verification process (Check_module_for_error(i)), which is shown in FIG. 3A, at step 310. To verify the entire design, the verification process is called with the top-level module.

The verification process 312 of FIG. 3B obtains the simulation results for the module in process at step 314. The desired simulation results are those stored in association with the module at step 308 in FIG. 3A. Decision step 316 tests whether or not the simulation results from the different simulation models of the model match. If a discrepancy between the simulation results of the different simulation models exists, the process stores data indicating the module is operating in error at step 318. If the module exhibiting the error contains sub-modules, decision step 320 directs the verification process to step 322, where the verification process 312 (Check_module_for_error(i)) is called for each sub-module at step 310. This process will repeat until a module in error has no sub-modules or until all the sub-modules of a module in error have been verified. If decision step 316 finds that there is no discrepancy between simulation results, the module and any sub-modules are verified, and the process exits.

Those skilled in the art will recognize that the sub-module verification shown in steps 214 and 322 may be implemented differently in different embodiments. Sub-modules may be verified sequentially, or concurrently. If sub-modules are verified sequentially, in whole or in part, the order in which sub-modules are selected for verification from the hierarchy of modules and sub-modules may be determined according to any number of selection algorithms known in the art for traversing search trees, such as breadth-first, depth-first, best-first, etc. Those skilled in the art will recognize that several module characteristics may be incorporated into the selection algorithm for optimization, including module size, number of sub-modules, ratio of non-modularized circuitry, etc.

Figure 4:
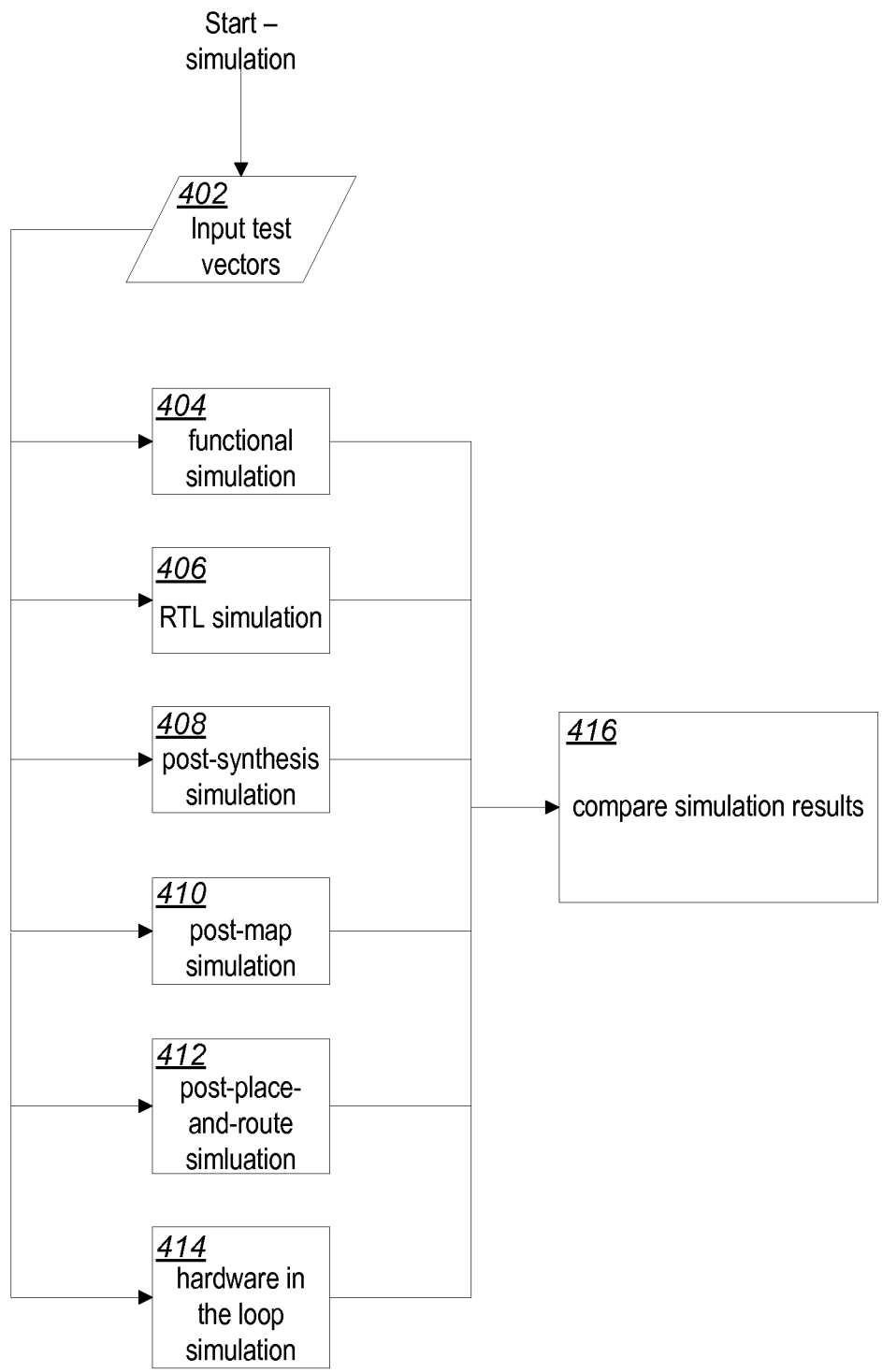
FIG. 4 illustrates, as an example, a flow diagram of the simulation step using different simulation models in accordance with various embodiments of the invention.

FIG. 4 illustrates, as an example, a flow diagram of the simulation step using different simulation models in accordance with various embodiments of the invention. In this particular example, the simulation models prepared from the various stages of translating a high-level design into a bitstream for programming a programmable logic device are used to verify the design. The simulations with the different simulation models include the following: functional simulation 404, RTL simulation 406, post-synthesis simulation 408, post-map simulation 410, post-place-and-route simulation 412, and hardware-in-the-loop simulation 414.

The functional simulation 404 is performed on a simulation model prepared from the high-level specification of the design, such as a hardware description language or the design as entered via a graphical user interface. After high-level netlisting of the high-level design specification, a register transfer level (RTL) simulation model may be prepared, which is used in the RTL simulation 406. Synthesizing the high-level netlist of the design provides the basis for preparing a post-synthesis simulation model for the post-synthesis simulation 408. Mapping the synthesized design to hardware components creates a mapped version of the design, from which a simulation model can be prepared for post-map simulation 410. From the mapped version of the design, the design is placed and routed to particular resources of a device, such as a PLD. A simulation model prepared from the placed and routed design is used in the post-place-and-route simulation 412. For a PLD simulation, a programming bitstream is generated from the placed and routed design. The bitstream may then be used for the hardware in the loop simulation 414.

The simulation results of these simulation models are compared for any discrepancy at block 416. Since running multiple simulations may be a time-consuming task, in one embodiment the simulations are run concurrently and simulation results are compared after each simulation step. For example, after each simulated clock cycle the results of the simulations are compared.

When, as here, simulation is performed using more than two simulation models, various embodiments of the invention can further optimize simulation and debugging by identifying the highest level module in which a discrepancy was found between simulation models (not shown). For example, if the simulation results of the top level module show identical simulation results from simulations 404, 406, and 408 and discrepancies for simulations 410, 412, and 414, it can be inferred that transformations from circuit design level 404 to 406 and from circuit design level 406 to 408 were logically correct, and the transformation from circuit design level 408 to 410 introduced an error into the design. Upon making this identification, various embodiments of the invention select simulation models to conduct simulations of sub-modules in a manner that isolates the circuit design level transformation in which discrepancy was detected for the top-level module. For example, further simulating of sub-modules can be optimized by using only simulation models for post-synthesis simulation 408 and post-map simulation 410 for simulation and comparison.

Once a module is identified as operating in error, the module must still be examined by a developer to determine why the error occurred. When a sub-module within a module contains an error, it is often beneficial for a developer to debug the sub-module first, as it may be the sole cause of error within the module. Various embodiments of the invention identify each module determined to contain errors, where each such module does not contain any sub-modules determined to contain errors. Data indicating that each such module is a source of error are stored for future reference.

As debugging is a manual and time consuming operation, identification of a module as a source of error can reduce overall development time. In order to isolate a source of error as narrowly as possible, it is desirable to further trace errors within modules that do not contain sub-modules. Depending on the designs and target hardware architecture, the verification and debugging can be further optimized by first performing a connected component analysis to determine which inputs and portions of a module affect a particular output. With that information, a module can then be subdivided into sub-modules, further enabling the source of errors to be traced on a finer level of granularity.

The connected component analysis is carried as follows. The internal connectivity of a module being analyzed is treated as a directed graph G=(V, E). A port on the module or a port on a primitive block within the module (such as LUT, FF, BRAM) is represented by a vertex "v" in V. An edge "e" from a vertex "v1" to a vertex "v2" means either: 1) there is a wire connecting an output port denoted by v1 to an input port denoted by v2; or 2) within a primitive block, an input port denoted by v1 affects an output port denoted by v2. Connectivity information may be obtained directly from the PLD architecture. For example, the output of a 4-input LUT may be affected by any combination of its four inputs based on the function implemented by the LUT. Those vertices with no incident edges are input ports of the module, and those with no outgoing edges are output ports of the module. Any other vertices are ports on primitive blocks within the module.

A connectivity graph can be constructed in various phases of the implementation flow (e.g., high-level compilation, synthesis, map, place-and-route). Each phase may produce a different connectivity graph due to the transformation and optimization performed. In any case, the most conservative approximation of the connectivity is used, such that an edge is added between two vertexes despite the fact that the associated ports may not necessarily be coupled.

Once the connectivity graph is constructed, a reachability test can be performed from each input port to each output port of the module. An output port with vertex v2 of the module is said to be affected by an input port with vertex v1 if v2 is reachable from v1. All affected modules can then be compartmentalized into a sub-module with vertex v1 as input port.

In simulation models simulated in software, the simulator can generally monitor internal signals within the module, and use these signals to identify portions of the module that affect a particular output. When simulation is conducted on a hardware simulation model, internal signals can be made visible outside of the hardware simulation model, through a hardware memory map interface. In this manner, the internal signals of different simulation models can be compared to test for discrepancy during simulation. Some embodiments of the invention refer to the monitoring or modification of internal signals as debug probes.

Figure 5A:
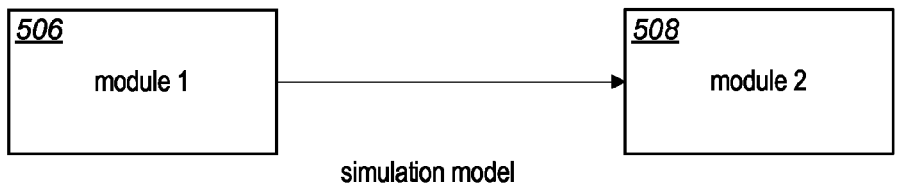
FIGS. 5A and 5B illustrate, as an example, a block diagram of an implementation of a hardware simulation model and hardware co-simulation memory map interface for use with debug probes in accordance with various embodiments of the invention.
Figure 5B:
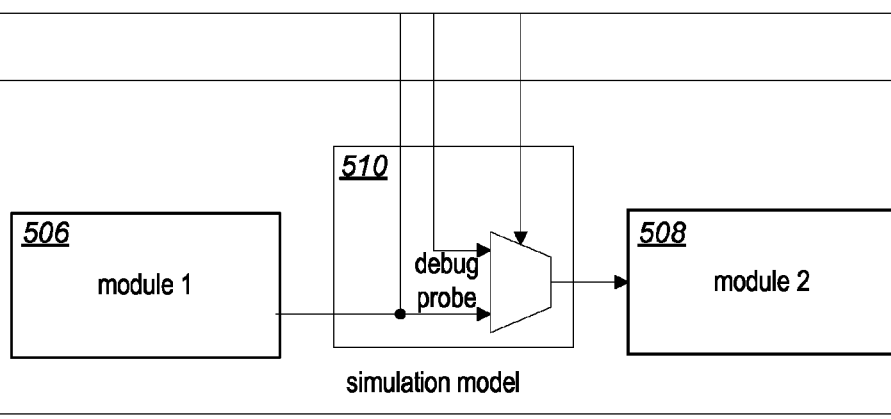

FIGS. 5A and 5B illustrate, as an example, a block diagram of an implementation of a hardware simulation model and hardware co-simulation memory map interface for use with debug probes in accordance with various embodiments of the invention. FIG. 5A shows memory map interface 502 and module 504, which includes sub-modules 506 and 508, prior to insertion of a debug probe. FIG. 5B shows module 504 having had debug probe 510 inserted between sub-modules 506 and 508. The debug probe 510, in combination with the memory map interface 502, is operable to both detect the value of the probed signal output from module 506 and change the value of the signal input to module 508. Further description of the memory map interface 502 and approaches for implementing the debug probe are found in U.S. Pat. No. 7,433,813, entitled, "EMBEDDING A CO-SIMULATED HARDWARE OBJECT IN AN EVENT-DRIVEN SIMULATOR" to Ballagh et al., which is incorporated herein by reference.

To assist a developer in the debugging process, identified sources of error can then be used to automatically insert debug probes or breakpoints in a simulation model. During a debug simulation, the simulation model can be configured to automatically stop execution or processing at points where debug probes have been inserted so behavior at these points can be observed more closely by the developer. Debug simulations may also be configured to display input and output data of modules, where debug probes have been manually inserted, at various times as desired by the developer. Further description of breakpoints in a co-simulation is found in U.S. Pat. No. 7,346,481, entitled, "HARDWARE CO-SIMULATION BREAKPOINTS IN A HIGH-LEVEL MODELING SYSTEM," to Ballagh et al., which is incorporated herein by reference.

Figure 6:
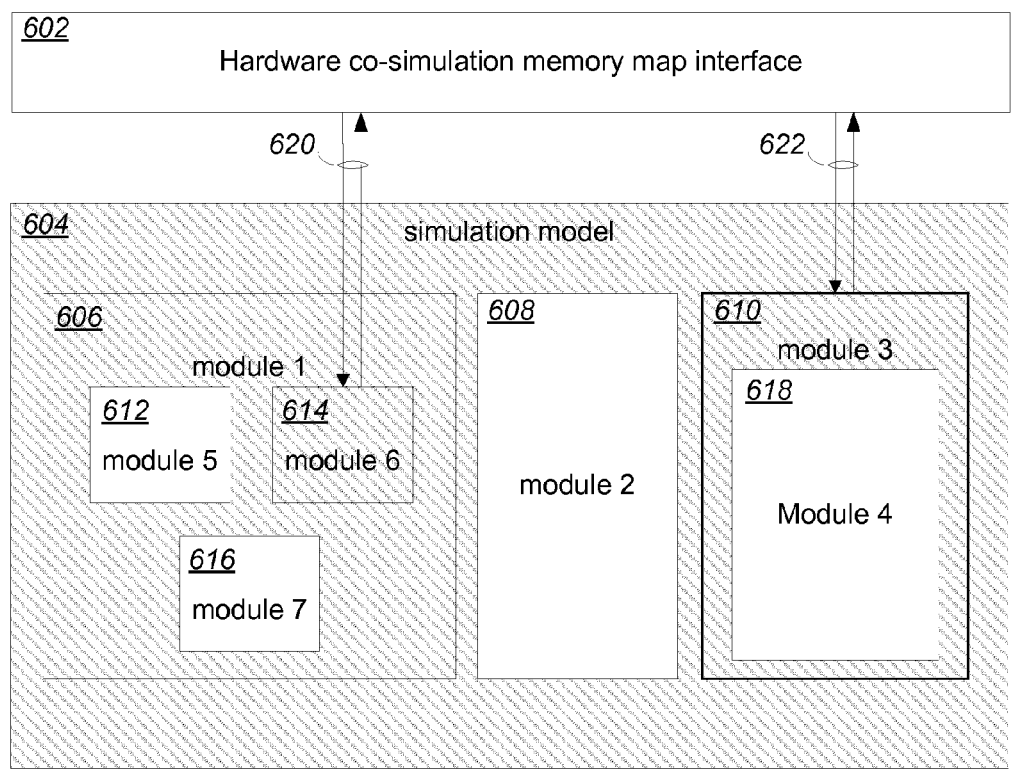
FIG. 6 illustrates, in block diagram form, an approach for automatically inserting debug probes into an example hardware simulation model in accordance with various embodiments of the invention.

FIG. 6 illustrates, in block diagram form, an approach for automatically inserting debug probes into an example hardware simulation model in accordance with various embodiments of the invention. The example simulation model covers top-level module 604, which includes sub-modules 606, 608, and 610. Sub-module 606 further includes sub-modules 612, 614, and 616, and sub-module 610 further includes sub-module 618.

The verification and debug processes described above may be supplemented to automatically insert a debug probe when the simulation results from different models for the same module do not match. In the example block diagram, the modules determined to have errors include modules 604, 606, 610 and 614, which are shaded to indicate they have been determined to operate in error. Modules 608, 612, 616, and 618 are un-shaded to indicate no errors were detected. Once the verification process determines that a module is operating in error and finds the lowest-level module which is under that module and also operates in error, a debug probe is inserted in that lowest-level module. For example, top-level module 604 was determined to operate in error, and the top-level module includes sub-modules 606 and 610, which were also determined to operate in error. Sub-module 606 includes the further sub-module 614. Sub-module 614 contains no further sub-modules and was also determined to operate in error. Thus, sub-module 614 is a lowest level sub-module with an error, and a debug probe is automatically inserted in sub-module 614.

For sub-module 610, which contains sub-module 618, no error was determined for sub-module 618. Thus, sub-module 610 is also a lowest level sub-module of the top-level module 604 determined to operate in error. A debug probe is also automatically inserted in module 610. Signal lines 620 are those used for interfacing with the debug probe in sub-module 614, and signal lines 622 are those used for interfacing with the debug probe in sub-module 610. While not shown, it will be appreciated that insertion of a debug probe would require regenerating the simulation model in order to have the debug probe operable in the simulation model.

In addition to inserting debug probes to input and output ports of identified modules, the automated process can further insert debug probes into some internal nodes within a sub-module using a systematic approach or based on heuristics. If there are only a few internal nodes, all of them can be probed. Otherwise, the process can first choose a subset of the nodes to probe, and repeatedly choose a different subset until all internal nodes are probed or the analysis is finished. For example, the process can initially place the probes evenly within modules, such that it can use a divide-and-conquer approach to narrow the probing region incrementally. Alternatively, the process can use the connectivity graph to determine which internal nodes affect a particular output and start focusing on them initially.

Those skilled in the art will appreciate that various alternative computing arrangements, including one or more processors and a memory arrangement configured with program code, would be suitable for hosting the processes and data structures of the different embodiments of the present invention.

Figure 7:
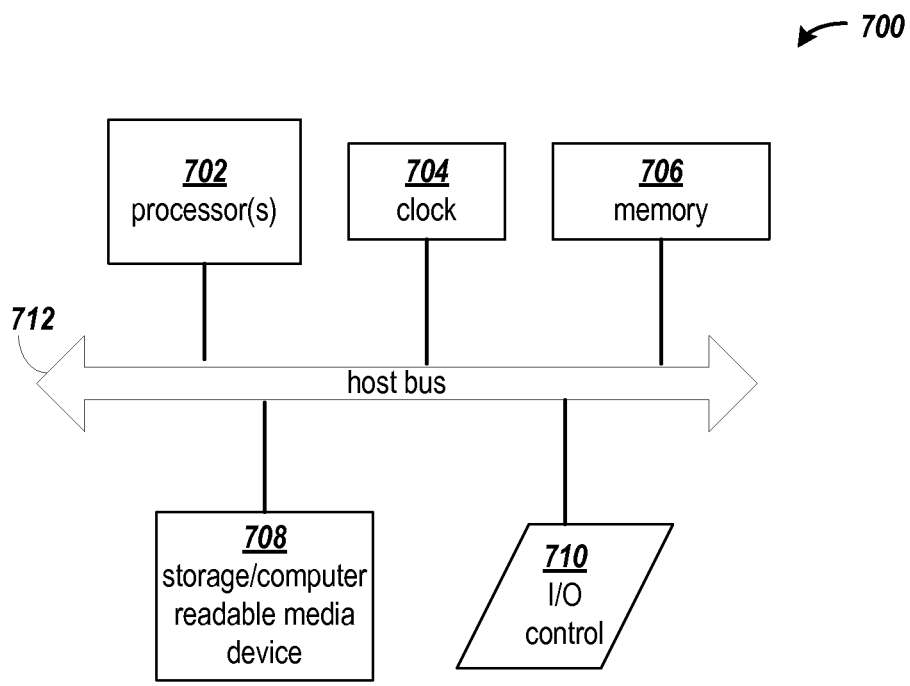
FIG. 7 illustrates a block diagram of an example computing arrangement on which the processes described herein may be implemented using a general purpose processor.

FIG. 7 is a block diagram of an example computing arrangement on which the processes described herein may be implemented using a general purpose processor. Those skilled in the art will appreciate that various alternative computing arrangements, including one or more processors and a memory arrangement configured with program code, would be suitable for hosting the processes and data structures and implementing the different embodiments of the present invention. The computer code, comprising the processes of the present invention encoded in a processor executable format, may be stored and provided via a variety of computer-readable storage media or delivery channels such as magnetic or optical disks or tapes, electronic storage devices, or as application services over a network.

Processor computing arrangement 700 includes one or more processors 702, a clock signal generator 704, a memory unit 706, a storage unit 708, and an input/output control unit 710 coupled to host bus 712. The arrangement 700 may be implemented with separate components on a circuit board, or may be implemented internally within an integrated circuit.

The architecture of the computing arrangement depends on implementation requirements, as would be recognized by those skilled in the art. For example, the processor 702 may be one or more general purpose processors, or a combination of one or more general purpose processors and suitable co-processors, or one or more specialized processors (e.g., RISC, CISC, pipelined, etc.).

The memory arrangement 706 typically includes multiple levels of cache memory and a main memory. The storage arrangement 708 may include local and/or remote persistent storage such as provided by magnetic disks (not shown), flash, EPROM, or other non-volatile data storage. The storage unit may be read or read/write capable. Further, the memory 706 and storage 708 may be combined in a single arrangement.

The processor arrangement 702 executes the software in memory 706 and/or storage 708 arrangements, reads data from and stores data to the memory 706 and/or storage 708 arrangements, and communicates with external devices through the input/output control arrangement 710. These functions are synchronized by the clock signal generator 704. The resources of the computing arrangement may be managed by a suitable combination of an operating system (not shown) and one or more hardware control units (not shown).

Figure 8:
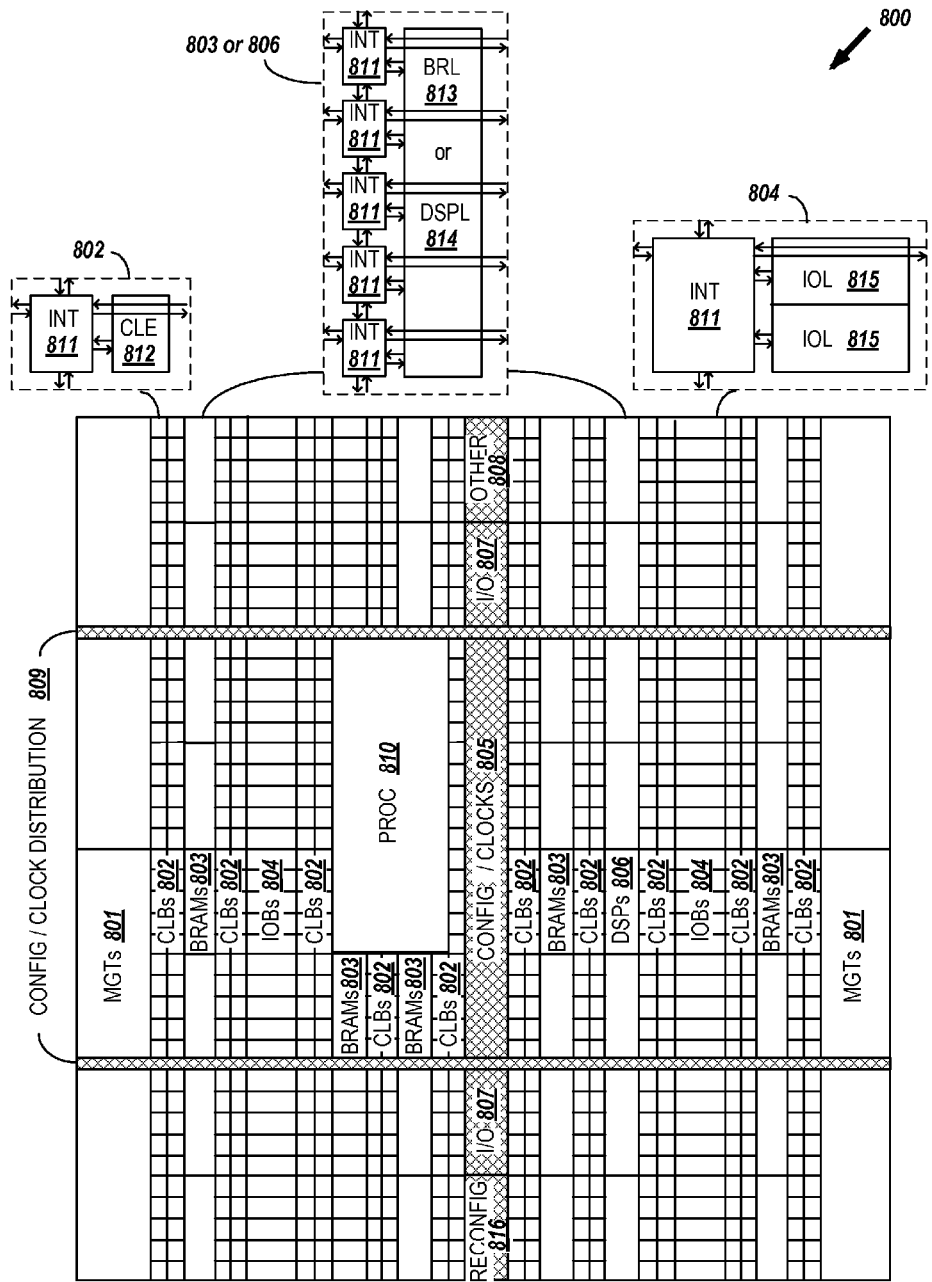
FIG. 8 illustrates a block diagram of a programmable integrated circuit for simulating a module in hardware in accordance with various embodiments of the invention.

FIG. 8 shows a block diagram of a field programmable gate array (FPGA) that may be used in accordance with various embodiments of the invention to simulate a module of a circuit design using a hardware simulation model. FPGAs can include several different types of programmable logic blocks in the array. For example, FIG. 8 illustrates an FPGA architecture (800) that includes a large number of different programmable tiles including multi-gigabit transceivers (MGTs 801), configurable logic blocks (CLBs 802), random access memory blocks (BRAMs 803), input/output blocks (IOBs 804), configuration and clocking logic (CONFIG/CLOCKS 805), digital signal processing blocks (DSPs 806), a reconfiguration port (RECONFIG 816), specialized input/output blocks (I/O 807), for example, e.g., clock ports, and other programmable logic 808 such as digital clock managers, analog-to-digital converters, system monitoring logic, and so forth. Some FPGAs also include dedicated processor blocks (PROC 810).

In some FPGAs, each programmable tile includes a programmable interconnect element (INT 811) having standardized connections to and from a corresponding interconnect element in each adjacent tile. Therefore, the programmable interconnect elements taken together implement the programmable interconnect structure for the illustrated FPGA. The programmable interconnect element INT 811 also includes the connections to and from the programmable logic element within the same tile, as shown by the examples included at the top of FIG. 8.

For example, a CLB 802 can include a configurable logic element CLE 812 that can be programmed to implement user logic plus a single programmable interconnect element NT 811. A BRAM 803 can include a BRAM logic element (BRL 813) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 806 can include a DSP logic element (DSPL 814) in addition to an appropriate number of programmable interconnect elements. An 10B 804 can include, for example, two instances of an input/output logic element (IOL 815) in addition to one instance of the programmable interconnect element INT 811. As will be clear to those of skill in the art, the actual I/O pads connected, for example, to the I/O logic element 815 are manufactured using metal layered above the various illustrated logic blocks, and typically are not confined to the area of the input/output logic element 815.

In the pictured embodiment, a columnar area near the center of the die (shown shaded in FIG. 8) is used for configuration, clock, and other control logic. Horizontal areas 809 extending from this column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic. For example, the processor block PROC 810 shown in FIG. 8 spans several columns of CLBs and BRAMs.

The present invention is thought to be applicable to a variety of systems for verification and debugging of circuit designs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of verifying and debugging a module of a circuit design, the module including two or more sub-modules, the method comprising:
   inputting test vectors for the module;
   simulating on a programmed processor, the module of the circuit design on different simulation models including at least a first simulation model, a second simulation model and a third simulation model of the module, the simulating using the test vectors for input to the module and the module being simulated separately from other modules of the circuit design;
   wherein the first simulation model is an RTL simulation model, the second simulation model is a post-synthesis simulation model, and the third simulation model is a hardware-in-the-loop simulation model;
   comparing output from the simulation of the module using the first simulation model, output from the simulation of the module using the second simulation model and output from the simulation of the module using the third simulation model; and
   in response to a discrepancy between outputs from simulation of the second and third simulation models and no discrepancy between outputs from simulation of the first and second simulation models, storing data indicative of an error in the module and, for each sub-module of the two or more sub-modules contained within the module, using the sub-module as the module repeating the inputting test vectors for the module, simulating the module using only the second and third simulation models, comparing output from simulating only the second and third simulation models, and storing data indicative of results of the comparing.

2. The method of claim 1, further comprising:
   determining sets of interconnected components within the module from data input to and data output from the simulation of the module; and
   using each determined interconnected set of components as the module, repeating the inputting test vectors for the module, simulating the module using only the second and third simulation models, comparing output from simulating only the second and third simulation models, and storing data.

3. The method of claim 1, further comprising:
   identifying each module indicated as containing an error that does not contain any sub-modules indicated as containing an error; and
   storing data indicating each identified module is a source of error.

4. The method of claim 1, further comprising:
   storing data indicating the module has been updated in response to user modification of the module;
   using the updated module as the module repeating the inputting, simulating and comparing using the first, second, and third simulation models; and
   in response to equivalence of the compared outputs, performing operations including:
      storing data indicating no operating error in association with the module and in association with a higher-level module that contains the updated module as a sub-module; and using the higher level module as the module repeating the inputting, simulating and comparing using the first, second, and third simulation models.

5. The method as in claim 1, wherein the simulating the circuit design on different simulation models includes concurrently simulating the at least first, second, and third simulation models.

6. The method of claim 1, further comprising automatically inserting a debug probe in the third model of the module having data indicative of an error, wherein the debug probe provides access to a signal value in the third model during simulation of the third model on a programmable logic device.

7. A system for verifying and debugging a module of a circuit design, the module including two or more sub-modules, the system comprising:
   a processor; and
   a memory storage arrangement coupled to the processor for storing the circuit design;
   wherein the processor and memory storage arrangement are coupled to perform operations including:
      inputting test vectors for the module;
      simulating the module of the circuit design on different simulation models including at least a first simulation model, a second simulation model and a third simulation model of the module, the simulating using the test vectors for input to the module and the module being simulated separately from other modules of the circuit design;
      wherein the first simulation model is an RTL simulation model, the second simulation model is a post-synthesis simulation model, and the third simulation model is a hardware-in-the-loop simulation model;
      comparing output from the simulation of the module using the first, second and third simulation models; and
      in response to a discrepancy between the outputs from simulation of the second and third simulation models and no discrepancy between outputs from simulation of the first and second simulation models, storing data indicative of an error in the module, and, for each sub-module of the two or more sub-modules contained within the module, using the sub-module as the module repeating the inputting test vectors for the module, simulating the module using only the second and third simulation models, comparing output from simulating only the second and third simulation models, and storing data indicative of results of the comparing.

8. The system of claim 7, further comprising:
   an input/output arrangement coupled to the processor; and
   a programmable logic device coupled to the input/output arrangement.

9. The system of claim 8, wherein the processor, memory storage arrangement, and input/output arrangement are coupled to:
   configure the programmable logic device to operate as the third simulation model;
   map inputs and outputs of the programmable logic device to corresponding inputs and outputs of the first and second simulation models; and
   send and receive simulation input and output data to and from the programmable logic device.

10. The system of claim 7, wherein the processor, memory storage arrangement, and input/output arrangement are coupled to:
   determine sets of interconnected components within the module from data input to and data output from the simulation of the module; and
   using each determined interconnected set of components as the module repeat the inputting test vectors for the module, simulating the module using only the second and third simulation models, comparing output from simulating only the second and third simulation models, and storing data.

11. The system of claim 7, wherein the processor, memory storage arrangement, and input/output arrangement are coupled to:
   identify each module indicated as containing an error that does not contain any sub-modules indicated as containing an error; and
   store data indicating each identified module is a source of error.

12. An article of manufacture, comprising:
   an electronically readable non-transitory storage medium storing instructions for causing a processor to perform operations for verifying and debugging a module of a circuit design, the module including two or more sub-modules and the operations including,
      inputting test vectors for the module;
      simulating the module of the circuit design on different simulation models including at least a first simulation model, a second simulation model and a third simulation model of the module, the simulating using the test vectors for input to the module and the module being simulated separately from other modules of the circuit design;
      wherein the first simulation model is an RTL simulation model, the second simulation model is a post-synthesis simulation model, and the third simulation model is a hardware-in-the-loop simulation model;
      comparing output from the simulation of the module using the first simulation model, output from the simulation of the module using the second simulation model and output from the simulation of the module using the third simulation model; and
      in response to a discrepancy between the outputs from simulation of the second and third simulation models and no discrepancy between outputs from simulation of the first and second simulation models, storing data indicative of an error in the module, and, for each sub-module of the two or more sub-modules contained within the module, using the sub-module as the module repeating the inputting test vectors for the module, simulating the module using only the second and third simulation models, comparing output from simulating only the second and third simulation models, and storing data indicative of results of the comparing.

13. The article of manufacture of claim 12, wherein the operations further include:
   determining sets of interconnected components within the module from data input to and data output from the simulation of the module; and
   using each determined interconnected set of components as the module, repeating the inputting test vectors for the module, simulating the module using only the second and third simulation models, comparing output from simulating only the second and third simulation models, and storing data.

14. The article of manufacture of claim 12, wherein operations further include:

identifying each module indicated as containing errors that does not contain any sub-modules indicated as containing an error; and storing data indicating each identified module is a source of error.

15. The article of manufacture of claim 12, wherein the operations further include:

storing data indicating a module has been updated in response to user modification of the module;

using the updated module as the module, repeating the inputting, simulating and comparing using the first, second, and third simulation models; and in response to equivalence of the compared outputs, storing data indicating no operating error in association with the module and no operating error in association with a higher-level module that contains the updated module as a sub-module, and using the higher level module as the module repeating the inputting, simulating and comparing using the first, second, and third simulation models.

* * * * *